(12) United States Patent
van Beek et al.

(10) Patent No.: US 8,729,973 B2
(45) Date of Patent: May 20, 2014

(54) MEMS RESONATOR

(75) Inventors: Jozef Thomas Martinus van Beek, Rosmalen (NL); Ronald Vogels, Eindhoven (NL)

(73) Assignee: NXP, B.V., Eindhoven (NL)

( * ) Notice: Subject to any disclaimer, the term of this patent is extended or adjusted under 35 U.S.C. 154(b) by 311 days.

(21) Appl. No.: 13/062,877

(22) PCT Filed: Sep. 7, 2009

(86) PCT No.: PCT/IB2009/053899
§ 371 (c)(1),
(2), (4) Date: Jul. 29, 2011

(87) PCT Pub. No.: WO2010/029490
PCT Pub. Date: Mar. 18, 2010

(65) Prior Publication Data
US 2012/0075027 A1  Mar. 29, 2012

(30) Foreign Application Priority Data

Sep. 9, 2008  (EP) ..................................... 08105284

(51) Int. Cl.
*H03B 5/30* (2006.01)
*H03B 1/02* (2006.01)
*H03L 1/04* (2006.01)
*B81B 7/02* (2006.01)

(52) U.S. Cl.
USPC ............ 331/154; 331/116 M; 331/70; 310/16

(58) Field of Classification Search
USPC .......... 333/186, 197, 200, 188; 310/315, 341, 310/15, 16, 25, 36; 331/66, 69, 176, 154, 331/156, 116 M, 70
See application file for complete search history.

(56) References Cited

U.S. PATENT DOCUMENTS

| 5,491,604 | A | 2/1996 | Nguyen et al. |
| 7,176,770 | B2 | 2/2007 | Ayazi et al. |
| 2005/0195050 | A1 | 9/2005 | Lutz et al. |
| 2007/0262831 | A1* | 11/2007 | Van Beek et al. ............. 333/186 |

FOREIGN PATENT DOCUMENTS

WO  2005/025057 A2  3/2005

OTHER PUBLICATIONS

Declaration of Non-Establishment of International Search Report and Written Opinion for International Patent Appln. No. PCT/IB2009/053899 (Dec. 16, 2009).
Mohan Jha et al., "Thermal Isolation of Encapsulated MEMS Resonators", J. of Microelectromechanical Systems, IEEE vol. 17 No. 1, Feb. 2008, pp. 175-184.
Jansen et al., "A CMOS-compatible 24MHz poly-SiGe MEMS oscillator with low-power heating for frequency stabilization over temperature", FCS 2011 Joint Conference of the IEEE International IEEE, May 2, 2011, pp. 1-5.
Nguyen et al., "Microresonator Frequency Control and Stabilization using an Integrated Micro Oven", (Conference Info: The Digest of Technical Papers, the 7th International Conference on Solid-State Sensors and Actuators, Jun. 1993, pp. 1040-1043.

* cited by examiner

*Primary Examiner* — Ryan Johnson

(57) ABSTRACT

A MEMS resonator comprises a resonator body (34), and an anchor (32) which provides a fixed connection between the resonator body (34) and a support body. A resistive heating element (R1,R2) and a feedback control system are used to maintain the resonator body (34) at a constant temperature. A location for thermally coupling the anchor (32) to the resistive heating element (R1,R2) is selected which has a lowest dependency of its temperature on the ambient temperature during the operation of the feedback control.

16 Claims, 3 Drawing Sheets

MEMS RESONATOR

This invention relates to MEMS resonators.

MEMS resonators are widely used as a reference oscillator in RF receiver circuits. The resonance frequency of a MEMS resonator exhibits a temperature drift of typically −30 ppm/K. For some applications this drift needs to be reduced significantly. For example, when using a MEMS resonator in a GSM reference oscillator the drift needs to be below +/−10 ppm over a temperature range of 100K.

This can be achieved by keeping the resonator at a constant temperature by placing the resonator in a temperature controlled feedback loop. In this case, the temperature is measured on, or in close vicinity of the resonator. This temperature is than stabilized by heating the resonator to a preset temperature.

WO2005/025057 discloses that this temperature control can be achieved by placing the resonator in a Wheatstone bridge. The electrical resistance of parts of the resonator are used for both temperature sensing as well as heating.

FIG. 1 is used to explain this known heating control concept. The series connected resistors R1 and R2 are part of the resonator and have a different temperature coefficient (TC). These two resistors form a first branch between an input voltage Vin and ground. Series connected resistors R3 and R4 are placed elsewhere at equal temperature, and they have the same temperature coefficient. They define a second branch in parallel with the first branch.

The feedback control system uses a differential amplifier 10 which receives as inputs the voltage at the junction between the first and second resistors R1,R2, and the voltage at the junction between the third and fourth resistors R3,R4.

The voltage difference Vout−Vref is zero when the ratio of the resonator resistors R1/R2 is equal to the ratio of the circuit resistances R3/R4, which is only valid for a unique temperature.

This voltage difference Vout−Vref is amplified and fed back into the Wheatstone bridge as the supply voltage rail, thereby heating up R1 and R2 until Vout−Vref equals zero and R1 and R2 reach their unique temperature.

Thus, the circuit of FIG. 1 provides heating until a fixed temperature is reached, which depends on the values of the resistances in the circuit.

The one-dimensional heat equation of an electrical and heat conducting body through which a electrical current flows is given by:

$$\frac{\partial^2 T}{\partial x^2} = -j^2 \frac{\rho}{\kappa} \quad (1)$$

with heat conductivity κ, electrical resistivity ρ, and current density j. It is assumed that heat conduction of the body dominates over other mechanisms of heat transport (e.g. radiation, convection). For MEMS resonators, this is a valid assumption.

From equation (1) it can be seen that the curvature, $$\frac{\partial^2 T}{\partial x^2}$$

of the temperature profile cannot equal zero when an electrical heating current is flowing through the MEMS resonator. This means that it is not possible to have a uniform temperature inside of the MEMS resonator when a heating current is applied through the resonator. As a result, the feedback mechanism may not provide correct control of the resonator electrical characteristics, as the measured temperature may not accurately reflect the temperature of the MEMS device.

According to the invention, there is provided a MEMS resonator, comprising:

a resonator body;

an anchor, which provides a fixed connection between the resonator body and a support body;

a resistive heating element; and a feedback control system for controlling the resistive heating element to provide heating in order to maintain the resonator body at a constant temperature, wherein the resistive heating element comprises first and second ends which are exposed to ambient temperature, wherein the resistive heating element provides an output voltage which is supplied to the feedback control system for maintaining a fixed temperature based on the output voltage, and wherein the anchor is thermally coupled to a location of the resistive heating element which has a lowest dependency of its temperature on the ambient temperature during the operation of the feedback control.

This arrangement provides thermal coupling between the resonator body and the resistive heating element through an anchor. This means that the resistive heating current does not need to pass through the resonator itself. The heating current only passes the anchors through which the resonator is connected to the support structure (substrate). In this way, only the anchors have a non-uniform temperature profile and the resonator has a single temperature taken from the point at which it connects to the anchor.

By thermally coupling the anchor to a location of the resistive heating element which has a lowest dependency of its temperature on the ambient temperature, the temperature of the resonator remains more stable. The feedback system is able to maintain an accurate temperature for the resonator, and the feedback system is far less sensitive to ambient temperature variations.

The resistive heating element can comprise first and second resistors in series, with the output voltage defined at the junction between the resistors. Thus, the resistive heating element can form part of the Wheatstone bridge circuit explained above.

The resistive heating element can comprise first and second portions which are aligned end to end which define the first and second resistors, and a perpendicular portion extending from the junction between the first and second portions, and which defines an output spur. The output spur is for providing the feedback voltage. The first and second portions then have different temperature dependency of their electrical resistance so that a specific temperature corresponds to a particular ratio of the two resistance values.

In the Wheatstone bridge circuit, the first and second resistors form a first branch, and third and fourth series-connected resistors form a second, parallel, branch. The feedback control system then further comprises a differential amplifier which receives as inputs the voltage at the junction between the first and second resistors, and the voltage at the junction between the third and fourth resistors, the output of the amplifier being provided to one end of the two branches. This amplifier output is then the supply voltage for the heating element.

The location of the resistive heating element is typically different to the point from which the output voltage is derived. This is because the output voltage is derived from the junction between two resistors, whereas the location (to which the anchor connects) is selected so that ambient temperature variations have the lowest effect.

The invention also provides a method of designing a MEMS resonator system, the resonator comprising a resonator body, and an anchor which provides a fixed connection between the resonator body and a support body, the method comprising:

providing a resistive heating element comprising first and second ends which are exposed to ambient temperature;

providing a feedback control system for controlling the resistive heating element to provide heating in order to maintain the resonator body at a constant temperature, wherein the method comprises selecting a location for thermally coupling the anchor to the resistive heating element which has a lowest dependency of its temperature on the ambient temperature during the operation of the feedback control.

The invention also provides a method of controlling a MEMS resonator, the resonator comprising:

a resonator body;

an anchor, which provides a fixed connection between the resonator body and a support body; and a resistive heating element which comprises first and second ends which are exposed to ambient temperature, wherein the method comprises:

thermally coupling the anchor to a location of the resistive heating element between the ends, deriving an output voltage from the resistive heating element, and supplying it to a feedback control system for maintaining a fixed temperature based on the output voltage, by controlling the resistive heating element, wherein the method comprises thermally coupling the MEMS resonator to a location of the resistive heating element which has a lowest dependency of its temperature on the ambient temperature during the operation of the feedback control.

Examples of the invention will now be described in detail with reference to the accompanying drawings, in which.

The same reference numbers have been used in different figures to denote the same components and layers, and the description is not repeated.

The invention provides a MEMS resonator in which a feedback control system is used for controlling a resistive heating element to provide heating in order to maintain the resonator body at a constant temperature. The resonator is coupled to the heating element through an anchor of the resonator to a location of the resistive heating element which has a lowest dependency of its temperature on the ambient temperature during the operation of the feedback control. This provides improved operation of the feedback temperature control in response to ambient temperature changes.

Figure 1:
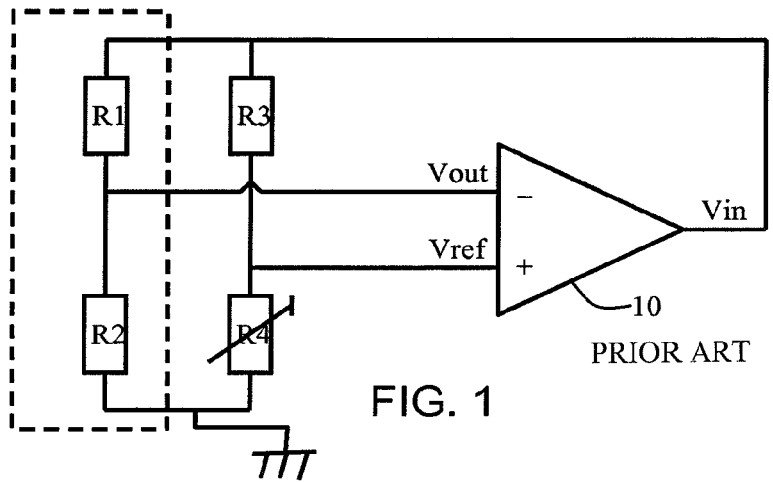
FIG. 1 shows a known Wheatstone bridge feedback control circuit and which is used in an example control system of the invention.
Figure 2:
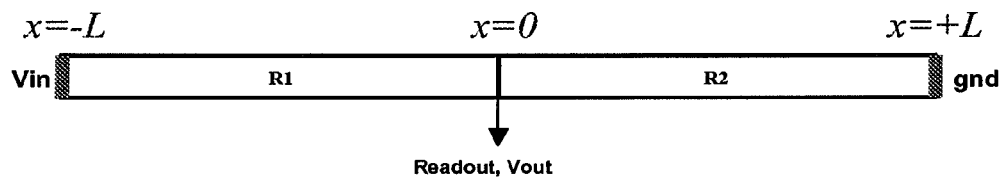
FIG. 2 shows a resistive heating element used in the system of the invention.

FIG. 2 shows a resistive heating element used in the system of the invention. The resistive heating element comprises two resistors R1 and R2, which form the temperature regulation feedback loop shown in FIG. 1.

The feedback loop does not automatically result in a constant temperature of the resonator, since R1 and R2 have a non-uniform temperature along their length (see equation 1). This can easily be understood considering the ends of R1 and R2, which are connected to the substrate. The substrate is at ambient temperature, which is the variable that needs to be compensated. Therefore, the temperature at the resistor ends cannot be compensated.

It will be shown below that there are locations along R1 and/or R2 that have almost constant temperature when placing these resistors in the feedback loop shown in FIG. 1.

This invention relates to an anchor layout which incorporates the resistors R1 and R2, and defines the location where the MEMS resonator is connected to the anchor so as to have a constant temperature as a result of the feedback control system, for example of the type shown in FIG. 1.

The principle of heating the resonator to a defined temperature is shown in FIG. 2. By applying a voltage (Vin) on one end of the resistor element, a current will flow through the resistors R1 and R2, which will heat up the resistors. The voltage Vout is read out between R1 and R2. The ends of R1 and R2 are held at ambient temperature, as is indicated by the bold lines, and are the locations where heat can escape to the outside world.

Simple solutions for the temperature profile T(x) can be derived assuming the temperature coefficient, α of R1 and R2 is small, and assuming the heat conduction, κ is not dependent on temperature. For the temperature profiles in R1 and R2 the following set of differential equations are valid:

$$-L < x < 0 \rightarrow \beta_1 \frac{\partial^2 T_1}{\partial x^2} + 1 = 0 \quad (2)$$

$$0 < x < L \rightarrow \beta_2 \frac{\partial^2 T_2}{\partial x^2} + 1 = 0$$

where $\beta_1$ and $\beta_2$ are defined as $$\beta_1 = \frac{\kappa}{\rho_1 j^2} \text{ and } \beta_2 = \frac{\kappa}{\rho_{21} j^2}$$

The following boundary conditions are valid, $$T_1(-L) = T_2(L) = T_0 \quad (3)$$

$$T_1(0) = T_2(0)$$

$$\frac{\partial T_1}{\partial x}(0) = \frac{\partial T_2}{\partial x}(0)$$

The solutions to the equations (2) and (3) is given by, $$-L < x < 0 \rightarrow T_1(x) = -\frac{1}{2\beta_1}x^2 + A_1 x + B_1 \quad (4)$$

$$0 < x < L \rightarrow T_2(x) = -\frac{1}{2\beta_2}x^2 + A_1 x + B_1$$

$$A_1 = -\frac{L}{4}\left(\frac{1}{\beta_1} - \frac{1}{\beta_2}\right)$$

$$B_1 = T_0 + \frac{L^2}{4}\left(\frac{1}{\beta_1} + \frac{1}{\beta_2}\right)$$

To keep the solution (4) simple it has been assumed that the temperature coefficient of both resistors is negligible. However, for the temperature feedback depicted in FIG. 1, the temperature coefficient cannot be zero.

In the Wheatstone feedback configuration, the ratio Vin/Vout, or equivalently R1/R2 is kept constant. These ratios should be dependent on temperature. From now on it is assumed that the temperature coefficient of the resistors has a (small but) finite value of temperature coefficient of resistance, α. The value of R1 and R2 as function of temperature are now given by:

$$R_1 = \frac{1}{A}\int_{-L}^{0} \rho_1(1+\alpha_1 T_1(x))dx \quad (5)$$

$$R_2 = \frac{1}{A}\int_{0}^{L} \rho_2(1+\alpha_2 T_2(x))dx$$

The ratio R1/R2 that is kept constant by the feedback loop is given by, $$\frac{R_1}{R_2} = \frac{\rho_1}{\rho_2}\frac{1+\alpha_1\left(T_0+\frac{L^2}{24}\left(\frac{5}{\beta_1}+\frac{3}{\beta_2}\right)\right)}{1+\alpha_2\left(T_0+\frac{L^2}{24}\left(\frac{3}{\beta_1}+\frac{5}{\beta_2}\right)\right)} \quad (6)$$

The part between brackets in the nominator and denominator represent the effective temperature T1 and T2 of R1 and R2, respectively.

It can be found where along the resistors this effective temperature is reached by combining these effective temperatures with equation (4):

$$T_1 = T_0 + \frac{L^2}{24}\left(\frac{5}{\beta_1}+\frac{3}{\beta_2}\right) \quad (7)$$

$$T_2 = T_0 + \frac{L^2}{24}\left(\frac{3}{\beta_1}+\frac{5}{\beta_2}\right)$$

$$T_1 = -\frac{1}{2\beta_1}x^2 - \frac{L}{4}\left(\frac{1}{\beta_1}-\frac{1}{\beta_2}\right)x + \frac{L^2}{4}\left(\frac{1}{\beta_1}+\frac{1}{\beta_2}\right)+T_0 \quad (8)$$

$$T_2 = -\frac{1}{2\beta_2}x^2 - \frac{L}{4}\left(\frac{1}{\beta_1}-\frac{1}{\beta_2}\right)x + \frac{L^2}{4}\left(\frac{1}{\beta_1}+\frac{1}{\beta_2}\right)+T_0$$

Combining (7) and (8) it can easily be seen that the solution for x is independent of ambient temperature $T_0$.

This means that there are locations on the two resistors where the temperature does not change with ambient temperature $T_0$. Connecting the resonator to one of these points will result in a uniform constant temperature $T_1$ or $T_2$ of the resonator regardless of the ambient temperature $T_0$. The location of these points are given by:

$$-L<x<0 \rightarrow x = \frac{L}{4}\left(\frac{\rho_2}{\rho_1}-1-\sqrt{\left(\frac{\rho_2}{\rho_1}\right)^2+2\frac{\rho_2}{\rho_1}+\frac{7}{3}}\right) \quad (9)$$

$$0<x<L \rightarrow x = \frac{L}{4}\left(1-\frac{\rho_1}{\rho_2}+\sqrt{\frac{7}{3}+2\frac{\rho_1}{\rho_2}+\left(\frac{\rho_1}{\rho_2}\right)^2}\right)$$

Equations (2) till (9) are only valid when:
The temperature coefficient of resistance α is small;
The heat conduction coefficient κ is not dependent on temperature; and The heat loss to the outside world is only through the ends of R1 and R2.

In reality only the first condition is valid. For silicon, the heat conduction is strongly dependent on temperature. Furthermore, the terminal that is needed to provide a voltage feedback signal (Vout) is a third path through which heat can be transported to the outside world.

Finite element simulations have been performed in order to take these effects into account. The layout that is simulated is shown in FIG. 3.

Figure 3:
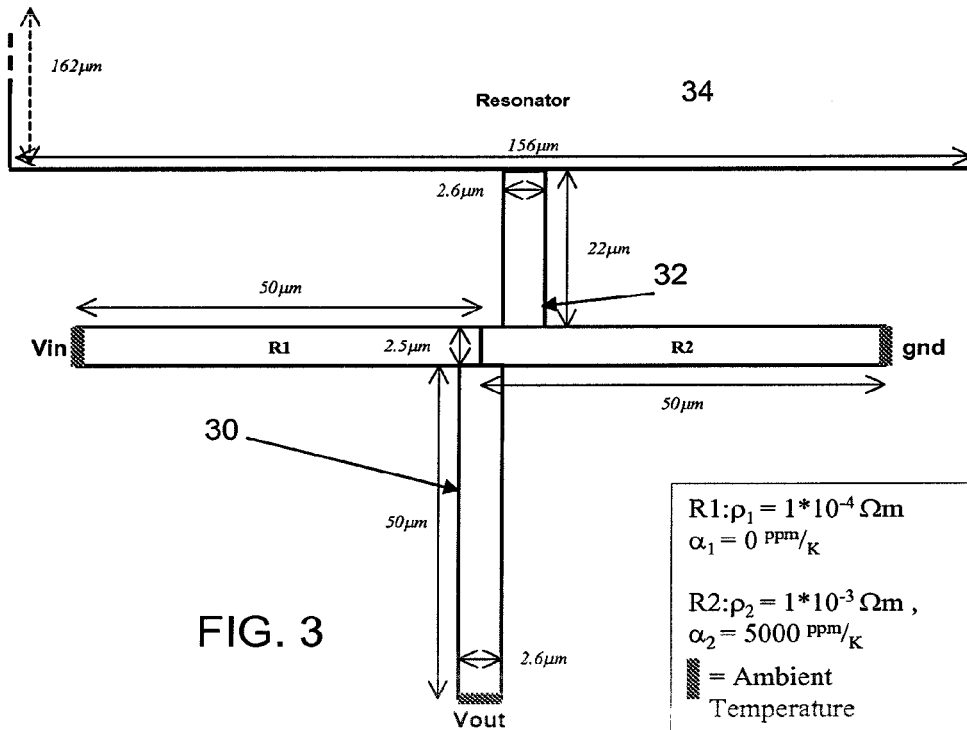
FIG. 3 shows how the resistive heating element of FIG. 2 is coupled to the resonator and how the electrical output signal is derived.

FIG. 3 shows the first and second resistors R1 and R2 in series, with the output voltage Vout defined at the junction between the resistors. The resistors R1 and R2 are defined as resistive track portions, with track width 2.5 μm and track length 50 μm. The first and second portions are aligned end to end. A perpendicular readout portion extends from the junction between the first and second portions, and defines an output spur 30. This also has length 50 μm and width 2.6 μm.

The first and second portions have different temperature dependency of their electrical resistance. The modelled example has resistivity of $10^{-4}$ Ωm and temperature coefficient α=0 for resistor R1, and resistivity of $10^{-3}$ Ωm and temperature coefficient α=5000 ppm/K for resistor R2 (at a reference temperature, such as room temperature).

The anchor is shown as 32 and this connects to the resonator body 34. The anchor has length 22 μm and width 2.6 μm. As shown, the anchor does not connect to the location of the junction between resistors R1 and R2. Instead, the location of the connection between the anchor and the resonator is explained below.

The anchor can be an electrical insulator or conductor, and should preferably be a good thermal conductor. The readout spur is an electrical conductor to enable the voltage to be read. All elements can be made out of a semiconductor for example silicon.

The resonator is connected to a support body through the anchor. In practice, the support body, anchor and resonator can all be part of the same layer, with trenches formed to define the resonator mass as an independent component, but with the anchor or anchors providing connections.

The connection of the resonator through the anchor to the heating element can be in different ways to that shown in FIG. 3. For example, the resonator 34 can be connected to multiple heating elements, for example one with a first anchor direction (up-down as shown in FIG. 3) and one with a second anchor direction (left-right). Only one heating element needs to have a readout voltage—the others can have dummy readouts. A single heating element can also have two locations which are insensitive to variations of ambient temperature, and can be connected at both of these locations to the resonator mass through respective anchors. These anchors may again be perpendicular to each other.

Figure 4:
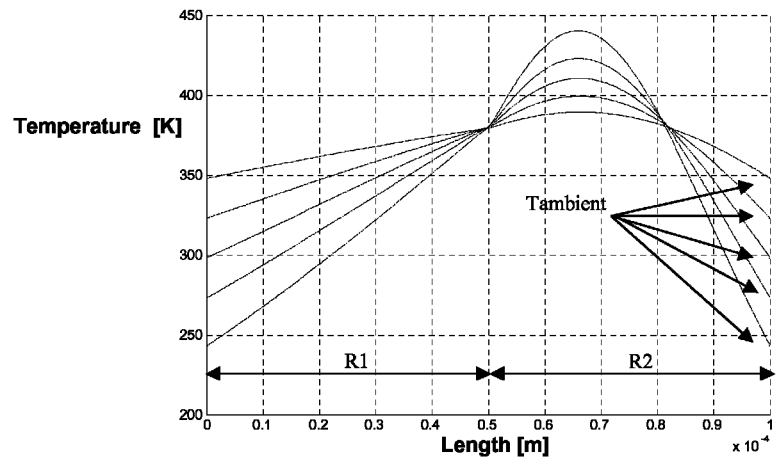
FIG. 4 is a first graph to show the effect of ambient temperature variations on the operation temperature at different points along the heating element.

The output of the simulation is the temperature profile along R1 and R2. In FIG. 4, the temperature across R1 (from length 0-50 μm) and R2 (50-100 μm) is represented. The dimensions and values for R1 and R2 (resistivity and temperature coefficient) that were used are given in FIG. 3. The results are shown as a table below and are plotted in the graph of FIG. 4.

| Tambient [K] | Vinput [V] | Vreadout [V] | J * 10^7 [A/m²] | I [uA] | R1 [Ohm] | R2 [Ohm] | P [mW] |
|---|---|---|---|---|---|---|---|
| 348 | 5.5738 | 5.2035 | 7.5012 | 262.5 | 1410.4 | 19819.7 | 1.46 |
| 323 | 7.619 | 7.1128 | 10.254 | 358.9 | 1410.3 | 19819.0 | 2.73 |
| 298 | 9.3184 | 8.6993 | 12.541 | 438.9 | 1410.3 | 19819.2 | 4.09 |
| 273 | 10.8512 | 10.1303 | 14.603 | 511.1 | 1410.4 | 19820.4 | 5.55 |
| 243 | 12.5806 | 11.7448 | 16.931 | 592.6 | 1410.4 | 19819.7 | 7.46 |

Ratio Vreadout/Vinput = 0.93357

This table is a simulation in which a constant ratio of resistance values (R1 and R2) is obtained, and shows the heating element drive current (I), the heating element power consumption (P), the current density (J), the ambient temperature (Tambient), the heating element drive voltage (Vinput) and the readout voltage (Vreadout).

From the graph of FIG. 4, it is clear that there are two points where the temperature is approximately constant at about 380K, one at about 50 µm and one around 82 µm. If the anchor of the resonator is connected at one of these points the resonator will be kept at 380K despite the changes of the ambient temperature. The ambient temperatures can be seen as the values at distances 0 and 100 µm.

The position of the anchor on the resistors determines the temperature fluctuation of the resonator. To determine the best position of the anchor, a simulation has been implemented in which the anchor is shifted along the resistors around the 50 µm point in steps on 0.1 µm.

At every step, the temperature of the resonator was determined for the ambient temperatures 348K, 323K, 298K, 273K and 243K.

Figure 5:
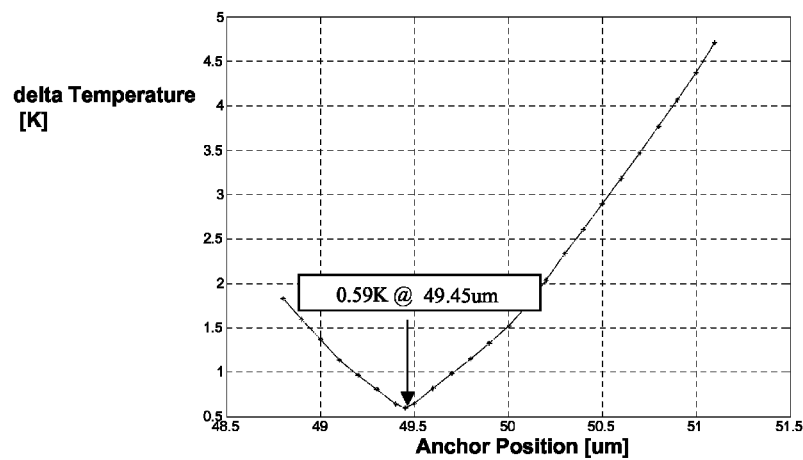
FIG. 5 is a second graph to show the effect of ambient temperature variations on the operation temperature at different points along the heating element.

FIG. 5 shows the difference of the maximum and minimum temperature at each position. From this graph it is clear that the best position of the anchor for heating up the resonator is at 49.45 µm. Here the temperature of the resonator, within the ambient temperature range of 348K to 243K, will have a variation of 0.59K. The variation of ambient temperature is therefore reduced by a factor of 178 at this particular location.

The invention is based on this recognition that there is an optimum point along the heating resistor to make the thermal connection to the resonator mass.

The anchor and resistor design described above can be manufactured using standard MEMS processing techniques.

A difference in temperature coefficient can be realized by means of doping R1 and R2 with a different doping level. It is known that differences in doping level results in differences of temperature coefficient, for example this is well known for p-type and n-type silicon.

Figure 6:
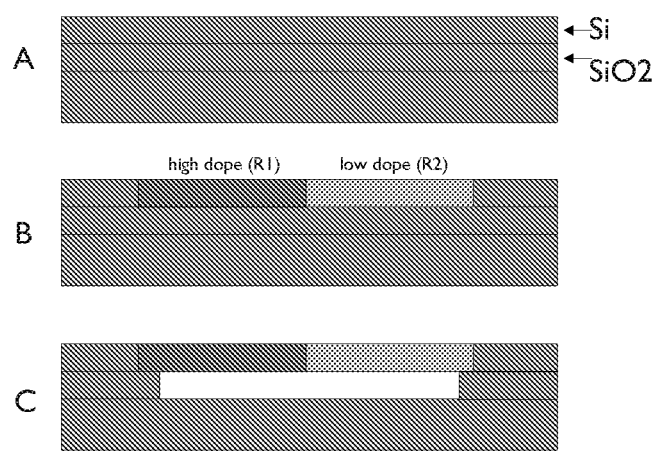
FIG. 6 shows in simplified form a manufacturing process to form the device of the invention.

An example of manufacturing process is shown in FIG. 6. The starting material is a Silicon-on-Insulator wafer as shown in FIG. 6A, with a mono-crystalline silicon substrate, a buried silicon oxide layer and a thin mono-crystalline silicon layer.

Different regions are implanted with a high dose for defining R1, and a low dose defining R2 (FIG. 6B). The anchor is finally released (together with the resonator) by removing the buried SiO2 layer (FIG. 7C).

The resonator design has not been described in detail in the description above, as the invention relates only to the thermal coupling of the resonator mass to the feedback control circuit. Many different resonator designs can be used, and this will be apparent to those skilled in the art. Similarly, the materials used have not been described in detail, as this will be routine as entirely conventional processes and materials can be used.

Only a single example of feedback control system (FIG. 1) has been described. However, the invention can be applied to other circuits which aim to provide a fixed temperature. By providing thermal coupling to the resonator in a way which makes the resonator temperature insensitive to ambient temperature variations, the operation of any feedback control system can be improved in the manner explained above.

Various modifications will be apparent to those skilled in the art.

The invention claimed is:

1. A MEMS resonator, comprising:
a resonator body;
an anchor, which provides a fixed connection between the resonator body and a support body;
a resistive heating element having a first end, a second end, and an elongated portion extending from the first end to the second end, a length of the elongated portion including a plurality of 0.1 µm segments, each of the segments having a respective dependency of its temperature on ambient temperature during operation of the resistive heating element; and
a feedback control system configured and arranged to control the resistive heating element to provide heating to maintain the resonator body at a constant temperature,
wherein the first and second ends of the resistive heating element are exposed to ambient temperature,
wherein the resistive heating element is configured and arranged to provide an output voltage which is supplied to the feedback control system for maintaining a fixed temperature of the resonator body based on the output voltage,
and wherein the anchor is coupled to the one of the plurality of segments having the lowest dependency of its temperature on the ambient temperature; and
wherein the resistive heating element comprises first and second resistors in series, with the output voltage defined at a junction between the resistors.

2. A MEMS resonator as in claim 1, wherein the resistive heating element comprises first and second portions which are aligned end to end which define the first and second resistors, and a perpendicular portion extending from the junction between the first and second portions, and which defines an output spur.

3. A MEMS resonator as in claim 2, wherein the first and second portions have different temperature dependency of their electrical resistance.

4. A MEMS resonator as in claim 1, wherein the feedback control system comprises a Wheatstone bridge defined by the first and second resistors forming a first branch, and third and fourth series-connected resistors forming a second, parallel, branch.

5. A MEMS resonator as in claim 4, wherein the feedback control system further comprises a differential amplifier which receives as inputs the voltage at the junction between the first and second resistors, and the voltage at the junction between the third and fourth resistors, the output of the amplifier being provided to one end of the two branches.

6. A MEMS resonator as in claim 1, wherein the anchor location of the resistive heating element is different to the point from which the output voltage is derived, and wherein the anchor is coupled at neither the first end nor the second end.

7. A method of designing a MEMS resonator system, the resonator having a resonator body, and an anchor which provides a fixed connection between the resonator body and a support body, the method comprising:
providing a resistive heating element having first and second ends, which are exposed to ambient temperature, and an elongated portion extending from the first end to the second end, a length of the elongated portion including a plurality of segments between the first end and the second end, each of the segments having a respective dependency of its temperature on ambient temperature during operation of the resistive heating element;
providing a feedback control system for controlling the resistive heating element to provide heating to maintain the resonator body at a constant temperature, and
selecting a location for coupling the anchor to one of the plurality of segments having the lowest dependency of its temperature on the ambient temperature, the location being at an inner region of the elongated portion that is between the first end and the second end.

8. A method of controlling a MEMS resonator having a resonator body an anchor, which provides a fixed connection between the resonator body and a support body, and a resistive heating element including first and second ends, which are exposed to ambient temperature, and an elongated portion extending from the first end to the second end, a length of the elongated portion including a plurality of segments, each of the segments having a respective dependency of its temperature on ambient temperature during operation of the resistive heating element, the method comprising:
coupling the anchor to a location of the resistive heating element between the ends at an inner location along the elongated portion,
deriving an output voltage from the resistive heating element, and supplying it to a feedback control system for maintaining a fixed temperature of the resonator body based on the output voltage, by controlling the resistive heating element, and
coupling the MEMS resonator to one of the plurality of segments having the lowest dependency of its temperature on the ambient temperature; and
wherein the resistive heating element comprises first and second resistors in series, with the output voltage defined at a junction between the resistors.

9. A method as in claim 8, wherein the feedback control system comprises a Wheatstone bridge circuit.

10. A MEMS resonator as in claim 1, wherein the resistive heating element is an elongate resistive track.

11. A method as in claim 7, wherein the resistive heating element is an elongate resistive track.

12. A method as in claim 8, wherein the resistive heating element is an elongate resistive track.

13. The MEMS resonator as in claim 1, wherein the anchor is coupled to one of the plurality of segments that is configured and arranged to remain at a substantially constant temperature during the operation of the feedback control.

14. A method as in claim 7, wherein the provided resistive heating element further comprises first and second resistors in series, with an output voltage defined at a junction between the first and second portions, and which defines an output spur.

15. A method as in claim 7, wherein the anchor is coupled at neither the first end nor the second end.

16. A MEMS resonator, comprising:
a resonator body;
an anchor, which provides a fixed connection between the resonator body and a support body;
a resistive heating element having a first end, a second end, and an elongated portion extending from the first end to the second end, a length of the elongated portion including a plurality of 0.1 µm segments, each of the segments having a respective dependency of its temperature on ambient temperature during operation of the resistive heating element; and
a feedback control system configured and arranged to control the resistive heating element to provide heating to maintain the resonator body at a constant temperature,
wherein the first and second ends of the resistive heating element are exposed to ambient temperature,
wherein the resistive heating element is configured and arranged to provide an output voltage which is supplied to the feedback control system for maintaining a fixed temperature of the resonator body based on the output voltage,
and wherein the anchor is coupled to the one of the plurality of segments having the lowest dependency of its temperature on the ambient temperature; and
wherein the anchor is coupled at neither the first end nor the second end.

* * * * *